(12) United States Patent
Naito

(10) Patent No.: US 11,778,293 B2
(45) Date of Patent: Oct. 3, 2023

(54) MOUNTING SUBSTRATE TO WHICH IMAGE SENSOR IS MOUNTED, SENSOR PACKAGE AND MANUFACTURING METHOD THEREOF

(71) Applicant: CANON KABUSHIKI KAISHA, Tokyo (JP)

(72) Inventor: Dai Naito, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 391 days.

(21) Appl. No.: 16/999,232

(22) Filed: Aug. 21, 2020

(65) Prior Publication Data

US 2021/0067664 A1    Mar. 4, 2021

(30) Foreign Application Priority Data

Sep. 2, 2019  (JP) .................................. 2019-159620
Jun. 15, 2020  (JP) .................................. 2020-103090
Jul. 16, 2020  (JP) .................................. 2020-122340

(51) Int. Cl.
*H01L 27/146* (2006.01)
*H04N 23/54* (2023.01)
*H05K 1/09* (2006.01)
*H05K 1/18* (2006.01)
(Continued)

(52) U.S. Cl.
CPC .............. *H04N 23/54* (2023.01); *H01L 23/04* (2013.01); *H01L 27/146* (2013.01); *H05K 1/09* (2013.01);
(Continued)

(58) Field of Classification Search
CPC ........ H04N 5/2253; H05K 1/09; H05K 1/182; H05K 3/0017; H05K 3/181;
(Continued)

(56) References Cited

U.S. PATENT DOCUMENTS 8,488,045 B2 * 7/2013 Busse .................. H04N 13/239
348/42
8,525,323 B2 * 9/2013 Yamazaki ................ H05K 3/30
257/434
(Continued)

FOREIGN PATENT DOCUMENTS

JP      2009081358 A     4/2009

OTHER PUBLICATIONS

EP1848034 Electronic component device, ShInko Electric Industries; Oct. 24, 2007 (Year: 2007).*
(Continued)

*Primary Examiner* — Steven T Sawyer
(74) *Attorney, Agent, or Firm* — ROSSI, KIMMS & McDOWELL LLP

(57) ABSTRACT

A sensor package that is configured by molding a frame to a mounting substrate by insert molding and that prevents adhering to components and terminals and reduces damage to the mounting substrate. The sensor package includes an image sensor, a mounting substrate to which the image sensor is mounted, a frame provided in the mounting substrate so as to surround the image sensor, and a cover attached to the frame so as to cover the image sensor. The mounting substrate includes terminals electrically connected with the image sensor and a groove provided in a predetermined depth between an area in which the frame is provided and the terminals.

12 Claims, 13 Drawing Sheets

(51) Int. Cl.
*H05K 3/00* (2006.01)
*H05K 3/18* (2006.01)
*H01L 23/04* (2006.01)

(52) U.S. Cl.
CPC ........... *H05K 1/182* (2013.01); *H05K 3/0017* (2013.01); *H05K 3/181* (2013.01); *H05K 2201/032* (2013.01); *H05K 2201/10121* (2013.01); *H05K 2201/10151* (2013.01)

(58) Field of Classification Search
CPC ... H05K 2201/032; H05K 2201/10121; H05K 2201/10151; H01L 27/14618; H01L 27/14636; H01L 27/1469; H01L 23/13; H01L 23/04; H01L 23/31; H01L 27/146
See application file for complete search history.

(56) References Cited

U.S. PATENT DOCUMENTS

| | | | | |
|---|---|---|---|---|
| 9,041,850 | B2* | 5/2015 | Oh | H01L 27/14618 348/340 |
| 2007/0019101 | A1* | 1/2007 | Minamio | H01L 27/14632 348/335 |
| 2007/0159703 | A1* | 7/2007 | Apel | H01L 27/14625 257/E31.117 |
| 2009/0084585 | A1 | 4/2009 | Matsumoto | |
| 2010/0025847 | A1* | 2/2010 | Tomura | H01L 24/83 257/737 |
| 2011/0074048 | A1* | 3/2011 | Shibita | H01L 23/3142 257/E23.116 |
| 2016/0260761 | A1 | 9/2016 | Jun | |
| 2017/0264800 | A1 | 9/2017 | Wang | |
| 2017/0280558 | A1 | 9/2017 | Ohara | |
| 2018/0210207 | A1* | 7/2018 | Machida | G02B 27/0176 |
| 2019/0267416 | A1 | 8/2019 | Kohama | |
| 2020/0098691 | A1* | 3/2020 | Itotani | H01L 21/563 |

OTHER PUBLICATIONS

Examination Report issued in Indian Appln. No. 202044037128 dated Nov. 29, 2021.
Extended European Search Report issued in European Appln. No. 20193552.5 dated Jan. 27, 2021.

* cited by examiner

MOUNTING SUBSTRATE TO WHICH IMAGE SENSOR IS MOUNTED, SENSOR PACKAGE AND MANUFACTURING METHOD THEREOF

BACKGROUND OF THE INVENTION

Field of the Invention

The present invention relates to a mounting substrate to which an image sensor is mounted, a sensor package and its manufacturing method, and in particular, relates to a technology of manufacturing a sensor package by molding a resin frame around a mounting substrate by insert molding.

Description of the Related Art

The following first and second configurations are known as sensor packages of image sensors like CMOS sensors that are used for digital cameras. The first configuration die bonds an image sensor to a ceramic package that can be reflow mounted to a substrate and seals by a cover after a wire bonding process. The second configuration die bonds an image sensor to a substrate directly, forms a frame around the substrate, and seals by a cover after a wire bonding process.

Although the second configuration has a problem that the image sensor may warp owing to difference in a linear expansion coefficient between the image sensor and the substrate, miniaturization and weight reduction can be achieved because a ceramic package becomes unnecessary. Moreover, since the second configuration can shorten signal distance from the image sensor to a bypass capacitor as compared with the first configuration, there is an advantage of reducing influence of magnetic noise on high speed signals, such as LVDS (Low Voltage Differential Signaling) and SLVS (Scalable Low Voltage Signaling). Because of such a reason, the second configuration is becoming mainstream rather than the first configuration.

Concerning the second configuration, Japanese Laid-Open Patent Publication (Kokai) No. 2009-81358 (JP 2009-81358A) discloses a technique that fits a substrate into a frame having an opening and adheres an inner wall of the frame to a side surface of the substrate. This thins the sensor package down and prevents moisture absorption (invasion of moisture) from the side surface of the substrate.

However, since the technique disclosed in the above-mentioned publication adheres the inner wall of the frame to the side surface of the substrate, desired adhesive strength cannot be obtained in a case where fluctuations in the size of the opening of the frame and the outside dimension are large. Moreover, even if the adhesion is possible, the adhesion may peel off by warp of the substrate due to temperature change or impact from outside.

To solve such a problem, there is a technique that molds a frame to a substrate by insert molding. The insert molding is a technique that molds a frame by clamping upper and lower sides of a substrate with metal molds and injecting resin into a cavity of the metal molds that is formed along a periphery of the substrate. Since a frame is firmly connectable with a substrate by using the insert molding, fear that the frame peels off from the substrate owing to temperature change or impact decreases. Moreover, when the cavity of the metal molds is formed so as to cover the side surface of the substrate, the resin frame is molded to the side surface too, which prevents the moisture absorption from the side surface of the substrate and prevents diffusion (dust emission) of dust produced when cutting the substrate.

In the meantime, when a frame is molded by the insert molding, fluctuation in thickness of the substrate may cause resin leakage at a time of molding the frame. The upper and lower metal molds have a gap for clamping a substrate. If a thickness of a substrate is less than a nominal size, an unnecessary gap will occur between the substrate and a clamp part of the metal molds, which may cause resin leakage at the time of molding the frame. When resin invades towards the center of the substrate by resin leakage, a possibility of adhering to components and terminals inside the substrate will become high. In the meantime, when a thickness of a substrate is more than the nominal size, the substrate will suffer a damage from the clamp part of the metallic molds eating into the substrate.

SUMMARY OF THE INVENTION

The present invention provides a sensor package that is configured by molding a frame to a mounting substrate by insert molding and that prevents adhering to components and terminals and reduces damage to the mounting substrate.

Accordingly, a first aspect of the present invention provides a sensor package including an image sensor, a mounting substrate to which the image sensor is mounted, a frame provided in the mounting substrate so as to surround the image sensor, and a cover attached to the frame so as to cover the image sensor. The mounting substrate includes terminals electrically connected with the image sensor and a groove provided in a predetermined depth between an area in which the frame is provided and the terminals.

Accordingly, a second aspect of the present invention provides a mounting substrate to which an image sensor is mounted, the mounting substrate including terminals electrically connected with the image sensor, and a groove provided in a predetermined depth between an area in which a frame is provided so as to surround the image sensor and the terminals.

Accordingly, a third aspect of the present invention provides a manufacturing method for a sensor package, the manufacturing method including applying an electrolytic plating process to terminals that are provided in a mounting substrate, a conductive part that is extended from the terminals to outside of the mounting substrate, and a connection part that is formed outside the terminals and connects the conductive part and the terminals, forming a groove in the mounting substrate by removing the connection part, and forming a frame from resin by insert molding on the mounting substrate outside the groove while clamping the mounting substrate to which the groove is formed with metal molds.

Accordingly, a fourth aspect of the present invention provides a manufacturing method for a sensor package, the manufacturing method including applying an electrolytic plating process to terminals that are provided in a mounting substrate, a conductive part that is extended from the terminals to outside of the mounting substrate, and a connection part that is formed outside the terminals and connects the conductive part and the terminals, insulating the terminals and the connection part by removing at least a part of the conductive part by etching to form a groove on the mounting substrate, and forming a frame from anaerobic thermosetting resin by insert molding on the mounting substrate outside the connection part while clamping the mounting substrate in which the terminals and the connection part are insulated with metal molds.

Accordingly, a fifth aspect of the present invention provides a manufacturing method for a sensor package, the manufacturing method including forming a groove outside terminals provided in a mounting substrate, mounting a chip in the groove, and forming a frame from resin by insert molding on the mounting substrate outside the groove while clamping the mounting substrate in which the chip is mounted in the groove with metal molds.

According to the present invention, adhering to components and terminals is prevented and damage to the mounting substrate is reduced in the sensor package that is configured by molding the frame to the mounting substrate by insert molding.

Further features of the present invention will become apparent from the following description of exemplary embodiments with reference to the attached drawings.

DESCRIPTION OF THE EMBODIMENTS

Figure 1:
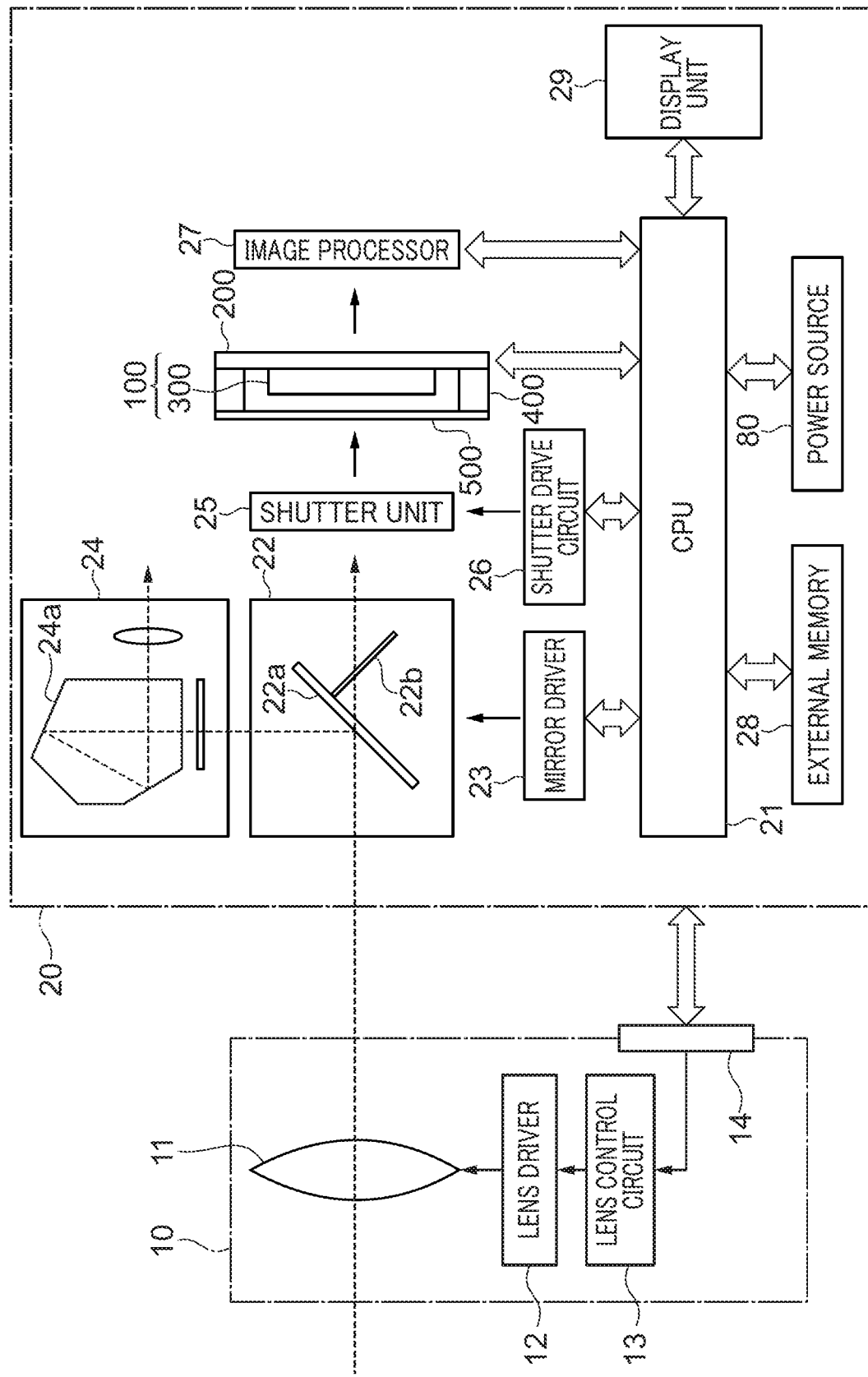
FIG. 1 is a view describing a schematic configuration of an image pickup apparatus to which a sensor package concerning an embodiment of the present invention is applied.

Hereafter, embodiments according to the present invention will be described in detail by referring to the drawings.

An image pickup apparatus to which a sensor package concerning an embodiment of the present invention is applied is described first.

FIG. 1 is a view showing a schematic configuration of the image pickup apparatus to which a sensor package concerning an embodiment of the present invention is applied. Specifically, the image pickup apparatus shown in FIG. 1 is a digital single lens reflex camera. The image pickup apparatus mainly consists of a lens unit 10 and a camera body 20.

The lens unit 10 has a lens group 11, lens driving unit 12, lens control circuit 13, and lens-mount contact 14. The lens group 11 consists of zoom lenses for changing a focal length freely in a certain range and focus lenses for adjusting a focus to an object. The lens driving unit 12 has an actuator that moves the zoom lenses in an optical axis direction to change optical magnification of an object image. Moreover, the lens driving unit 12 has an actuator that moves the focus lenses in the optical axis direction to adjust a focus to an object. Although these actuators are stepping motors or vibration actuators, for example, other mechanisms may be employed.

The lens control circuit 13 controls operations of the lens driving unit 12 by supplying drive signals designating moving amounts and moving speeds of the zoom lenses and focus lenses to the lens driving unit 12. When the lens unit 10 is connected to the camera body 20, the lens-mount contact 14 are connected with a camera-mount contact (not shown) provided in the camera body 20. This enables communication between a below-mentioned CPU 21 provided in the camera body 20 and the lens control circuits 13.

The camera body 20 has the CPU 21, a mirror unit 22, a mirror driver 23, a finder unit 24, a shutter unit 25, a shutter driving circuit 26, a sensor package 100, an image processor 27, an external memory 28, a display unit 29, and a power source 80. It should be noted that the external memory 28 and the power source 80 are detachably attached to the camera body 20.

The CPU 21 is a processor that achieves various functions of the image pickup apparatus by totally controlling operations of respective parts of the lens unit 10 and the camera body 20. The mirror unit 22 has a main mirror 22a and a sub mirror 22b, and changes a direction of photographing light flux (incident light flux) that passes the lens unit 10 by changing angular positions of the main mirror 22a and sub mirror 22b. The mirror driver 23 consists of a motor, a gear train, etc. (not shown) and drives the main mirror 22a and sub mirror 22b in response to signals received from the CPU 21.

The finder unit 24 has a pentagonal prism 24a that reflects the photographing light flux reflected by the main mirror 22a to convert into an erected normal image, and a photometry sensor (not shown) that detects luminance of an object. The shutter unit 25 is a mechanical focal-plane shutter, for example, and is provided with a mechanism that runs a front blade group and a rear blade group (not shown). The shutter driving circuit 26 controls an operation of the shutter unit 25 in response to control signals from the CPU 21. When a user observes an object image through the finder unit 24, the shutter unit 25 is controlled so as to obstruct the photographing light flux toward the sensor package 100. At a time of image pick-up, the shutter unit 25 is controlled so as to obtain desired exposure time in response to a release signal.

The sensor package 100 has an image sensor 300 (see FIG. 2) that receives the incident light that passes the lens group 11. Details of the sensor package 100 will be described later.

The image sensor 300 is a CMOS sensor, for example, and has image pickup pixels that pick up an object and phase difference detection pixels that detect a phase difference of object images for auto-focusing of an imaging surface phase difference method. The CPU 21 calculates a defocus amount on the basis of the phase difference (distance between pupil-divided images) of object images in segmented regions that is obtained from the pixel signals output from the phase difference detection pixels. Then, the CPU 21 transmits the calculated defocus amount to the lens control circuit 13 through the lens-mount contact 14. The lens driving unit 12 drives the focusing lens of the lens group 11 according to the control signal from the lens control circuit 13.

Moreover, an object image (optical image) formed on the image pickup pixels of the image sensor 300 is converted into an image pickup signal (analog signal) by photoelectric conversion, and the image pickup signal is sent to the image processor 27. The image processor 27 converts the analog signal sent from the image sensor 300 into a digital signal, and then generates image data by applying image processes, such as a color correction process, a demosaic process, a tone correction (gamma correction) process, and a YC separation process, to the digital signal.

The external memory 28 is a nonvolatile memory, such as an SD memory card or a compact flash, that is detachable and attachable to the camera body 20, The image data generated by the image processor 27 is compressed by a predetermined compression technology, such as a JPEG system. The compressed image data is saved in the external memory 28. The display unit 29 includes a TFT liquid crystal panel and is openable and rotatable. The display unit 29 can display an image of image data that is converted by the image processor 27 and can display an image of image data that is read from the external memory 28 and is elongated. Moreover, the image processor 27 converts the object image formed on the image sensor 300 into a moving image at a predetermined frame rate during moving image capturing. The display unit 29 displays the moving image. The power source 80 is a secondary battery that is detachable from the camera body 20, a home AC adaptor, etc. that supplies electric power to respective parts of the image pickup apparatus.

Figure 2A:
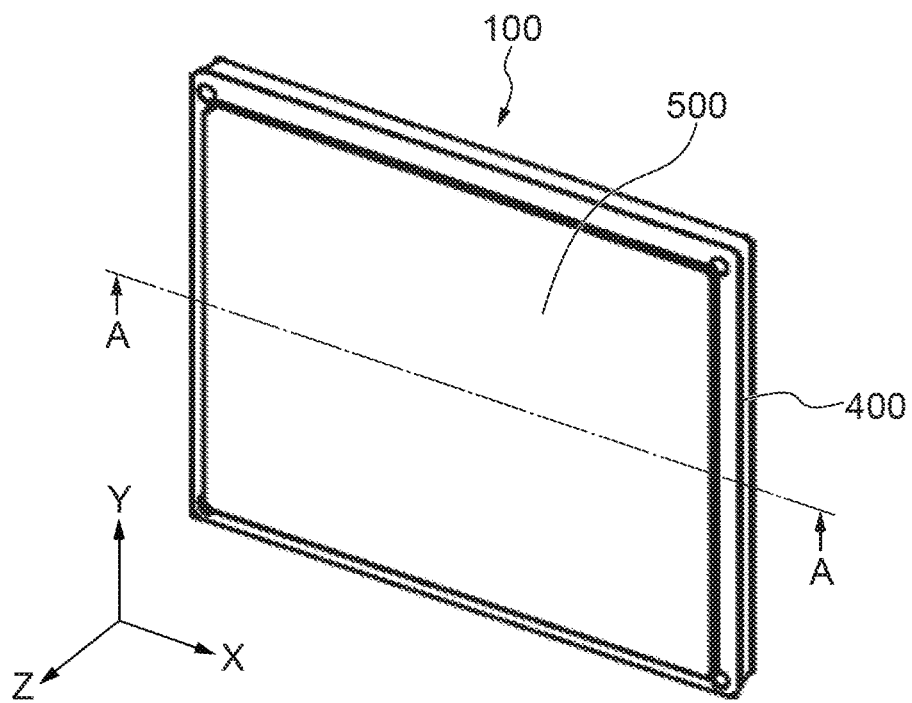
FIG. 2A and FIG. 2B are perspective views showing a sensor package concerning a first embodiment.
Figure 2B:
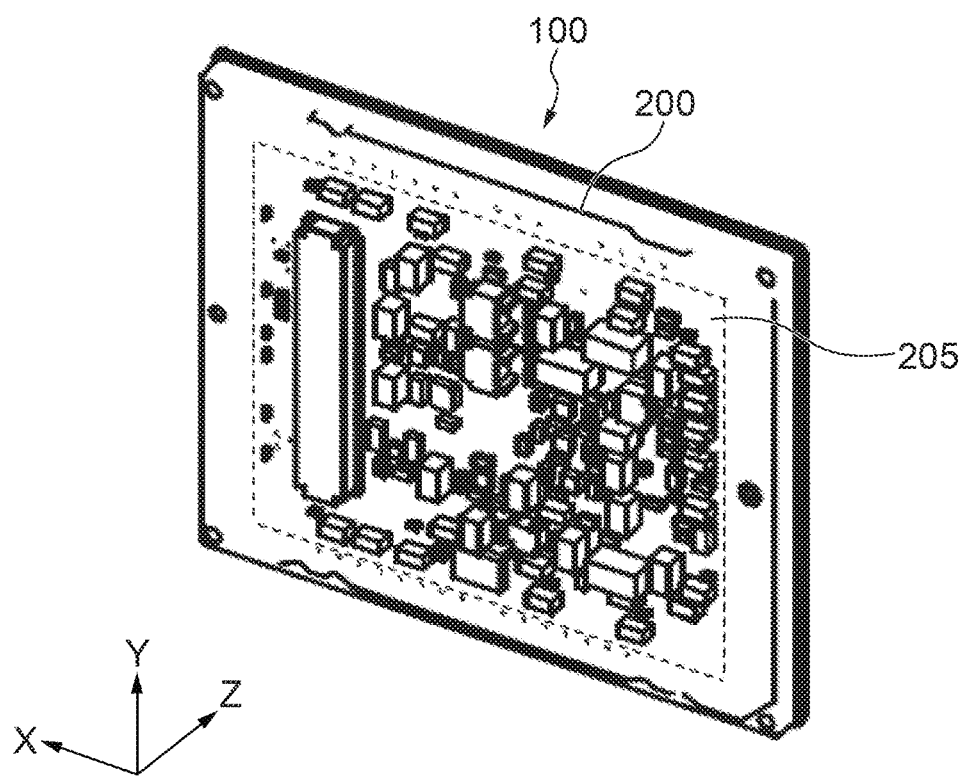
Figure 3:
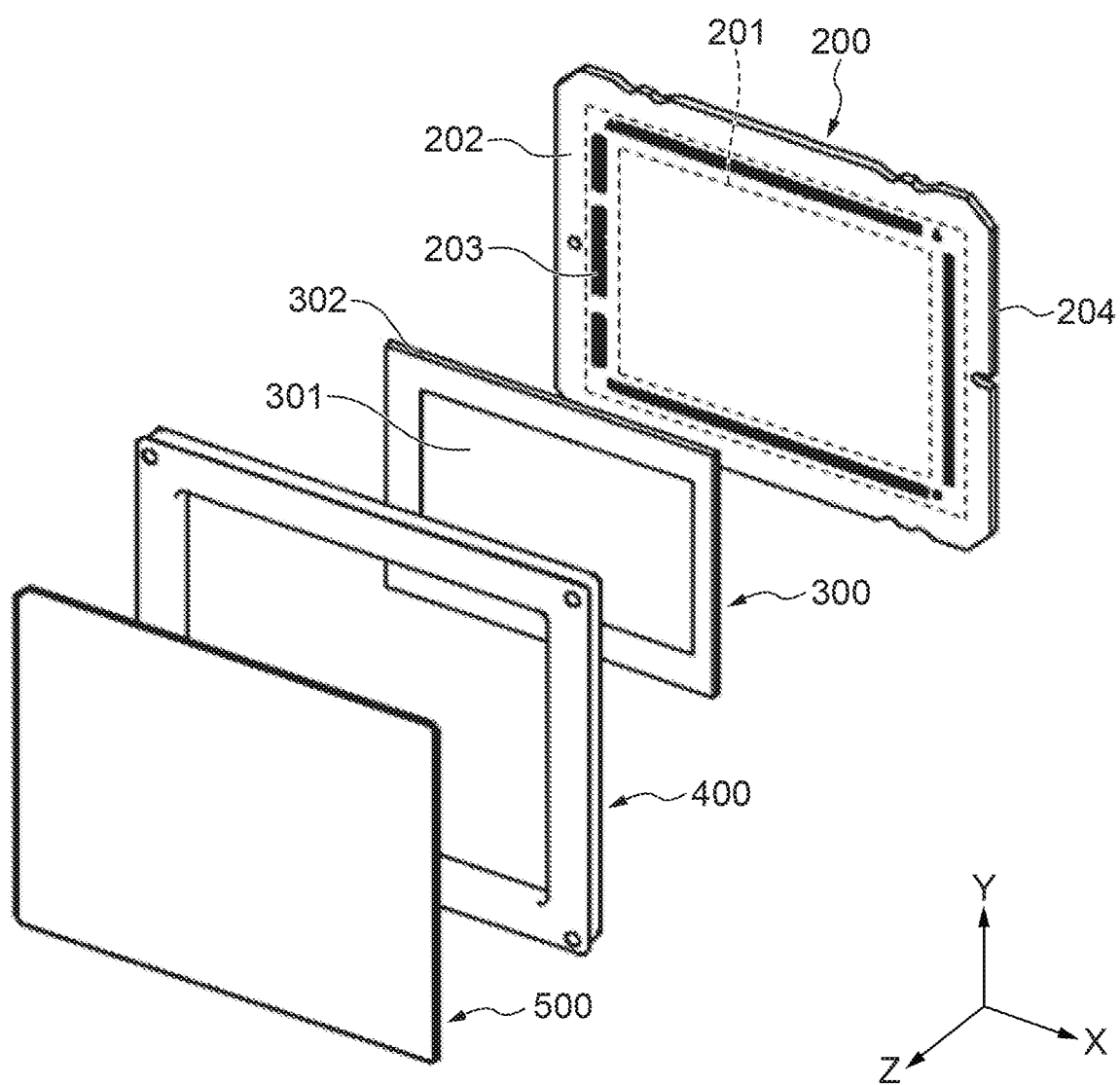
FIG. 3 is an exploded perspective view showing the sensor package of FIG. 2A.

Next, the sensor package 100 concerning the first embodiment will be described in detail. FIG. 2A is a perspective view showing the sensor package 100 viewed from the front side. FIG. 2B is a perspective view showing the sensor package 100 viewed from the back side. FIG. 3 is an exploded perspective view showing the sensor package 100.

The sensor package 100 is provided with a printed circuit board 200, the image sensor 300, a frame 400, and a cover 500. It should be noted that an X-axis, a Y-axis, and a Z-axis that mutually intersect perpendicularly are defined in order to show correlations of respective parts on the drawings as shown in FIG. 2A, FIG. 2B, and FIG. 3. The Z-axis intersects an image plane of the image sensor 300 at right angle. The Y-axis is parallel to the short side of the image sensor 300. The X-axis is parallel to the long side of the image sensor 300. The coordinate is shown in the drawings from FIG. 4A similarly.

The sensor package 100 is a hollow package that is configured by die bonding the image sensor 300 to the printed circuit board 200 and an opening (a front side) of the frame 400 is sealed by the cover 500 after attaching the frame 400 so as to surround the image sensor 300. The printed circuit board 200 is an example of a mounting substrate to which the image sensor 300 is mounted. The mounting substrate is not limited to this.

The printed circuit board 200 is a buildup substrate that is formed by accumulating insulators like glass clothes and copper patterns in a wafers form and by forming interlayer connection via holes with laser beam machining. Solder resist layers are formed on copper patterns of the uppermost layer (front surface) and the lowermost layer (back surface) of the printed circuit board 200 by spray coating or mask printing for insulation. The solder resist layers are not formed on terminals of the front and back surfaces of the printed circuit board 200 to which components are mounted or to which a wire bonding process is applied. An electrolytic gold-plating process is applied to the terminals so as to keep connection reliability. It should be noted that a thickness of a gold plating layer is 0.1 to 0.3 micrometer in a non-electrolytic gold-plating process in general. The thickness can be thickly set to several micrometers in the electrolytic gold-plating process. Accordingly, the electrolytic gold-plating process is suitable for the gold-plating process applied to a terminal for the wire bonding process to which a gold wire is welded.

A die bonding area 201 to which the image sensor 300 is attached and a frame area 202 to which the frame 400 is attached are established on the printed circuit board 200. Wire bonding terminals 203 to which the image sensor 300 is connected by the wire bonding are provided in an area that is outer than the die bonding area 201 and that is inner than the frame area 202.

The image sensor 300 is a solid-state image pickup device in which a light receiving element and an amplifier are arranged for every unit cell and that outputs an image signal by reading an electrical signal that is photoelectrically converted. The image sensor 300 is fixed on adhesive like silver paste applied to the die bonding area 201 of the printed circuit board 200 with a die bonder apparatus. An effective image sensing area 301 corresponding to a field angle at the time of photographing is established in the central part of the image sensor 300. Wire bonding terminals 302 for connecting with the wire bonding terminals 203 of the printed circuit board 200 is provided in the outer periphery of the image sensor 300. The wire bonding terminals 203 of the printed circuit board 200 are respectively connected with the wire bonding terminals 302 of the image sensor 300 through gold wires of which diameter is several tens micrometers by the wire bonding process, and they are electrically connected.

The frame 400 is molded to the frame area 202 of the printed circuit board 200 with thermosetting resin (hereinafter referred to as "resin") by insert molding mentioned later. The frame 400 has a larger thickness in the X-direction or the Y-direction than a thickness of the image sensor 300. The cover 500 is fixed to the front side of the frame 400 with adhesive, so that the sensor package 100 is sealed.

The frame 400 further covers the side surface 204 of the printed circuit board 200. The printed circuit board 200 is normally manufactured by dividing a large substrate to which many substrates are printed into respective substrates by router cutting or dicing. When dust, such as a glass cloth or a copper pattern, generated from the side surface of the printed circuit board 200 adheres to the wire bonding terminals 203 in the time of division, the strength of the wire bonding will become insufficient. In this embodiment, since the side surface 204 of the printed circuit board 200 is covered by the frame 400, the dust emission from the side surface 204 is prevented. The cover 500 is made from glass or crystal and plays a role of sealing the sensor package 100 and a role of reducing moire and aberration by using birefringence.

A component mounting area 205 is provided in the surface opposite to the surface to which the image sensor 300 is mounted. Various kinds of components 208 for output of an image signal, such as a bypass capacitor for noise suppression, a regulator for power supply to the image sensor 300, and connectors for connection with the outside, are soldered to the component mounting area 205 by reflow mounting.

Figure 4A:
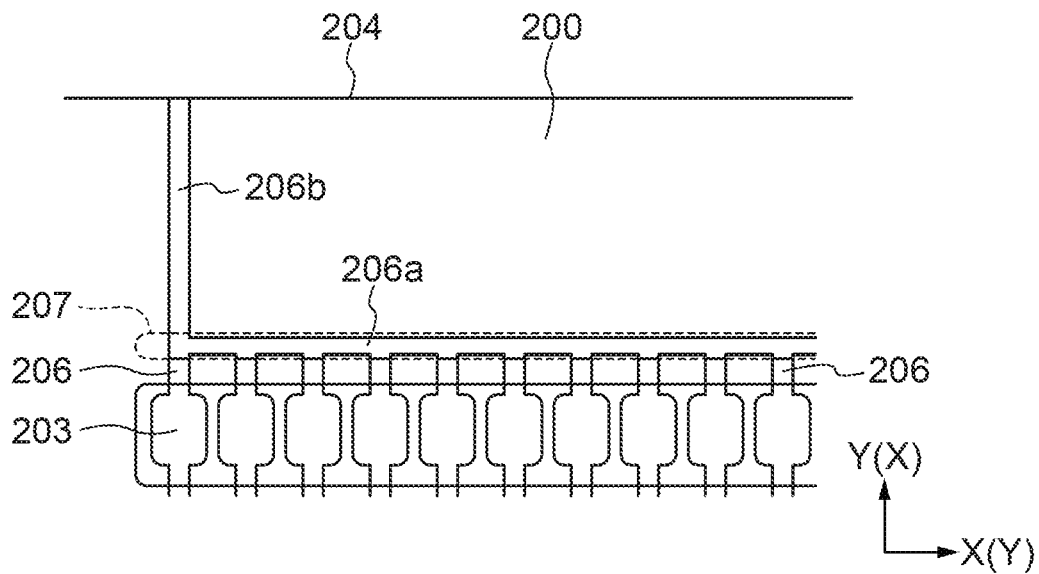
FIG. 4A and FIG. 4B are enlarged views showing a wire bonding terminal section provided in a printed circuit board that constitutes the sensor package of FIG. 2A.
Figure 4B:
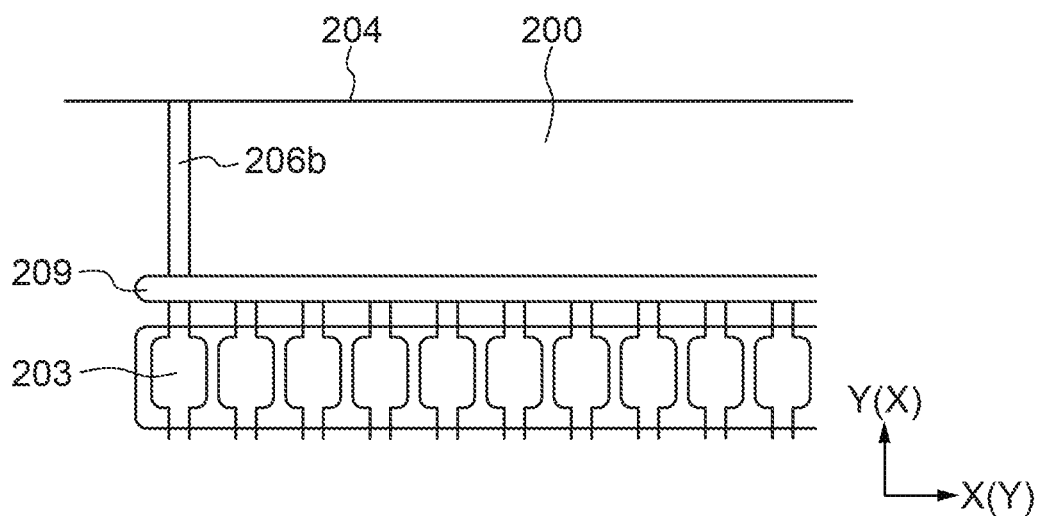

FIG. 4A and FIG. 4B are enlarged views showing wire bonding terminals 203 provided in the printed circuit board 200 and the vicinity thereof (hereinafter referred to as a "wire bonding terminal section"). FIG. 4A shows a state earlier than an etch-back process mentioned later, and FIG. 4B shows a state later than the etch-back process. The wire bonding terminal section has a part parallel to the X-axis and a part parallel to the Y-axis as shown in FIG. 4A and FIG. 4B. Configurations of these parts are identical.

In FIG. 4A, the electrolytic gold-plating process is applied to the wire bonding terminal 203 in order to improve the connection reliability with the gold wires as mentioned above. In order to perform the electrolytic gold-plating process, it is necessary to extend a plating bar (conductive part) 206 from the wire bonding terminals 203 to the outside of the substrate (outward from the side surface 204) and to form a gold-plating film while supplying electric current. When the many wire bonding terminals 203 that transmit an image signal, a power supply signal, a GND signal, etc. are arranged on the printed circuit board 200, the following demerits arise if the plating bars 206 are taken out from all the wire bonding terminals 203 to the outside of the substrate.

One of the demerits is influence on signal characteristics because the plating bars 206 that are taken out from the wire bonding terminals 203 and remain in the printed circuit board 200 as-is become stubs. Particularly, since the image signals treat high speed signals, such as LVDS and SLVS, the influence will remarkably lower the signal characteristics. Moreover, another one of the demerits is reduction of a GND characteristic of the printed circuit board 200. This is because a GND solid pattern that would be originally formed in the frame area 202 of the periphery of the printed circuit board 200 to keep the GND characteristic of the printed circuit board 200 will be divided in order to take out the plating bars 206 to the outside of the substrate.

Consequently, the sensor package 100 is configured to connect the plating bars 206 from the respective wire bonding terminals 203 at an initial state of manufacture of the printed circuit board 200. Then, the etch-back process that finally removes the plating bar by etching is employed.

In more detail, as shown in FIG. 4A, the plating bars 206 are connected in the etch-back region 207 and a plating bar connection part 206a is provided during the manufacturing process of the printed circuit board 200. A copper pattern is exposed without applying the solder resist in the etch-back region 207. Furthermore, a plating bar 206b is provided to the outside of the substrate from the plating bar connection part 206a. When the electrolytic gold-plating process is applied in the state of FIG. 4A while supplying electric current to the plating bar 206 from the outside of the substrate, a gold-plating film is formed over the wire bonding terminals 203.

When the etch-back region 207 is etched after applying the electrolytic gold-plating process to the wire bonding terminals 203 in the state shown in FIG. 4A, the copper pattern is removed as shown in FIG. 4B. A groove 209 (FIG. 7) of which depth is equal to a sum of the thickness of the solder resist and the thickness of the copper pattern of the outer layer is formed in the etch-back region 207. In the state of FIG. 4B, the electrolytic gold-plating process is given to the wire bonding terminals 203 and the number of the plating bars extended toward the outside of the substrate is small. Thereby, the demerits mentioned above are conquered. That is, since the plating bars do not become stubs that reduce the signal characteristics and the GND characteristic does not lower, the wire bonding terminals 203 suitable for the wire bonding process can be formed.

Figure 5:
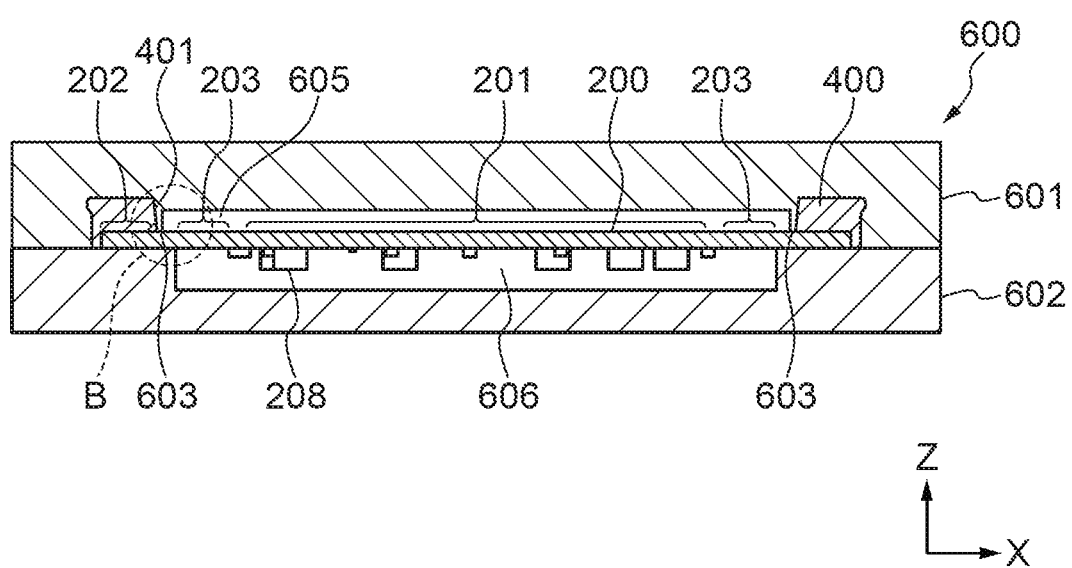
FIG. 5 is a sectional view showing a state where metal molds are attached to the printed circuit board of FIG. 4B taken along the line A-A of FIG. 2A.

Next, the process of molding the frame 400 into the frame area 202 of the printed circuit board 200 by the insert molding will be described. FIG. 5 is a sectional view taken along the line A-A shown in FIG. 2A in a state where metal molds 600 (not shown in FIG. 2A) are attached to the printed circuit board 200 in order to mold the frame 400.

The metal molds 600 consist of an upper metal mold 601 and a lower metal mold 602 that clamp the printed circuit board 200 in the thickness direction of the printed circuit board 200. Contact of the upper mold 601 to the die bonding area 201 of the printed circuit board 200 causes insulation failure of the solder resist applied on the copper pattern. Moreover, if the upper mold 601 contacts the wire bonding terminals 203, cracks will occur on the wire bonding terminals 203 and a dust particle will be transferred. In order to avoid such problems, a space 605 is provided above the wire bonding terminals 203. In the meantime, the frame 400 is miniaturized by being close to an inner wall 401 of the frame 400 to the wire bonding terminals 203, which miniaturizes the sensor package 100. As a result of these conditions, the upper metal mold 601 has a holding part that holds the outer side of the wire bonding terminals 203 of the printed circuit board 200 in a frame shape in a narrow clamp region 603. In order to avoid interference with the components 208 mounted on the printed circuit board 200, a space 606 is established in the lower metal mold 602 that supports the printed circuit board 200.

Since the printed circuit board 200 is manufactured by laminating insulator layers and copper pattern layers, thickness tolerance of a finished substrate becomes ±several ten to several hundred micrometers because of thickness variations of the layers. When the number of laminated layers increases, the thickness tolerance increases, which causes problems described hereinafter by referring to FIG. 6A through FIG. 6C.

Figure 6A:
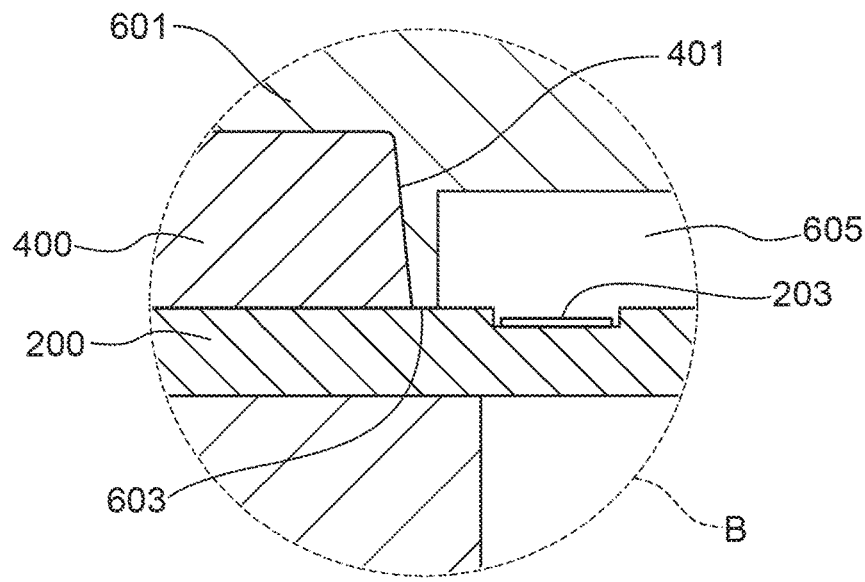
FIG. 6A, FIG. 6B, and FIG. 6C are views describing problems resulting from thickness tolerance of a printed circuit board using the configuration in the area B shown in FIG. 5.
Figure 6B:
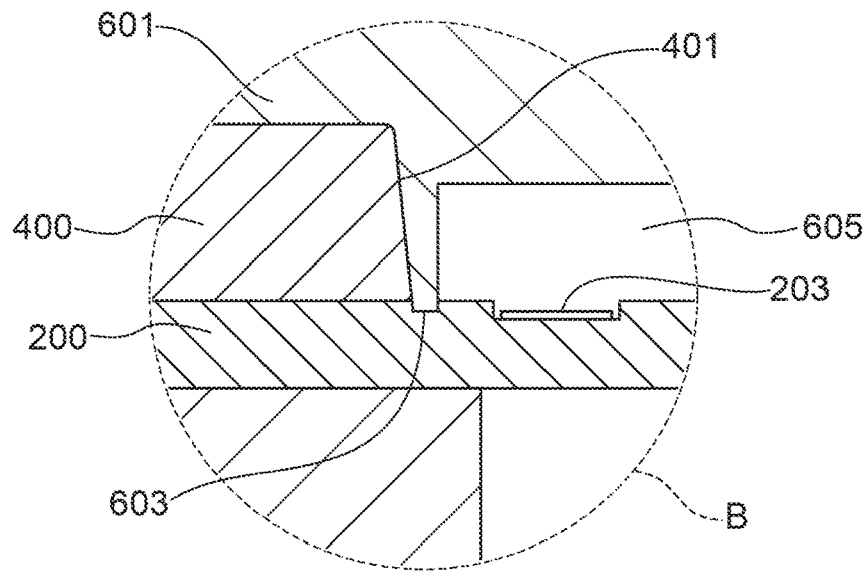
Figure 6C:
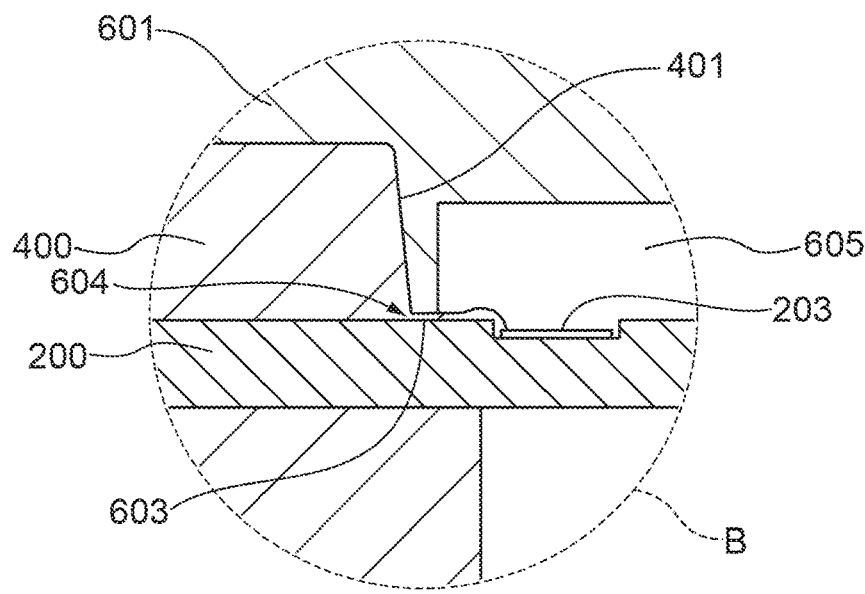

FIG. 6A through FIG. 6C are views describing the problems that occur owing to the thickness tolerance of the printed circuit board 200 at the time when the frame 400 is molded to the printed circuit board 200 by the insert molding. FIG. 6A through FIG. 6C show the configuration of the area B shown in FIG. 5.

FIG. 6A shows relationship between the printed circuit board 200 and the metal molds 600 in a case where the thickness of the finished printed circuit board 200 is equal to a design value. In this case, since a gap in the clamp region 603 in which the upper metal mold 601 clamps the printed circuit board 200 becomes zero (0), the frame 400 is appropriately molded by performing the injection molding of resin from the outside.

FIG. 6B shows relationship between the printed circuit board 200 and the metal molds 600 in a case where the thickness of the finished printed circuit board 200 is larger (thicker) than the design value. In this case, the clamp region 603 of the upper metal mold 601 sinks into the printed circuit board 200 (an inroad), which gives a serious damage to the printed circuit board 200. Specifically, the solder resist layer of the printed circuit board 200 may be damaged or the copper pattern may be cut. As a result, the printed circuit board 200 may be destroyed. Even if it is not destroyed, dust occurred by the damage of the solder resist layer may adhere to the wire bonding terminals 203, which causes a trouble in the wire bonding process.

FIG. 6C shows relationship between the printed circuit board 200 and the metal molds 600 in a case where the printed circuit board 200 does not have the etch-back region 207 and the thickness of the finished printed circuit board 200 is smaller (thinner) than the design value. In this case, the gap 604 of several micrometers or several ten micrometers occurs between the clamp region 603 of the upper metal mold 601 and the printed circuit board 200. When resin is injected from the outside into the cavity of the metal molds 600 in order to mold the frame 400, the resin leaks through the gap 604 to the printed circuit board 200 inside the clamp region 603. Since the inner wall 401 of the frame 400 is close to the wire bonding terminals 203, when the leaked resin adheres to the wire bonding terminals 203, a trouble occurs in the wire bonding process and a manufacturing yield is lowered.

Methods, such as providing a spacer between the upper metal mold 601 and the lower metal mold 602 depending on the thickness of the printed circuit board 200, can be considered in order to avoid the various problems occurred in the cases of FIG. 6B and FIG. 6C. However, if a thickness of each printed circuit board 200 is measured one by one and the metal molds 600 are adjusted according to a measurement result, productivity will be lowered and a manufacturing cost will increase. This embodiment solves these problems by having a configuration hereinafter described by referring to FIG. 7.

Figure 7:
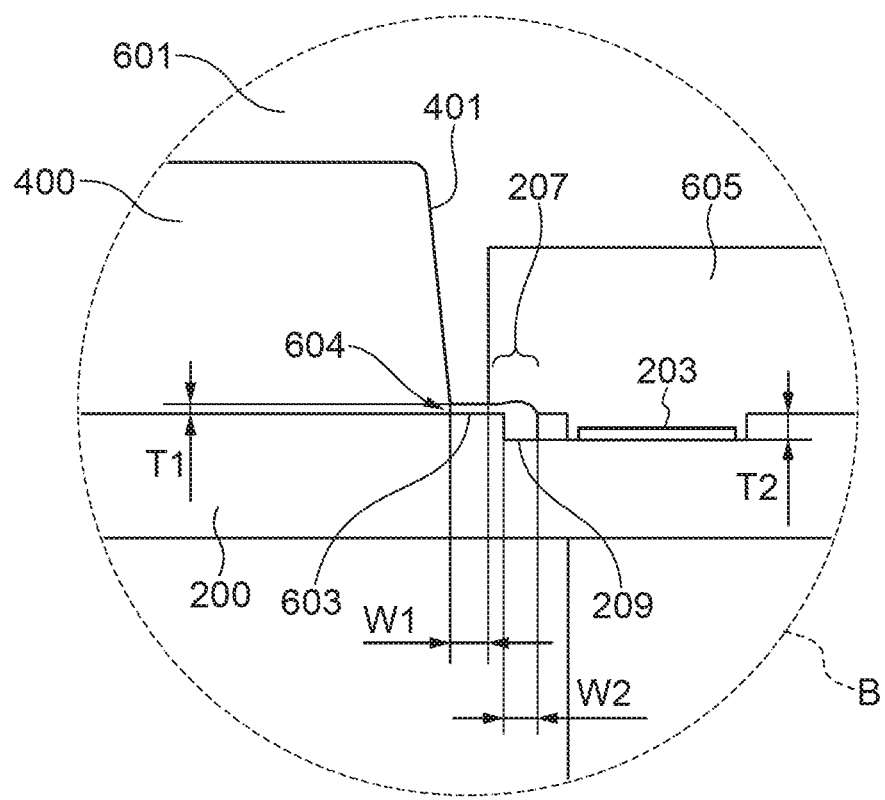
FIG. 7 is an enlarged view of the area B shown in FIG. 5.

FIG. 7 is a view showing the configuration of the printed circuit board 200 concerning this embodiment and is an enlarged view of the area B in FIG. 5. It should be noted that hatching showing a section of a member is omitted in FIG. 7 in order to unveil a measurement of each part.

As described by referring to FIG. 4A, the etch-back region 207 is provided outside the wire bonding terminals 203 of the printed circuit board 200. When the thickness of the finished printed circuit board 200 is smaller than the design value, resin leaks through the gap 604 between the printed circuit board 200 and the upper metal mold 601 as with the case of FIG. 6C.

However, since the etch-back region 207 is provided between the gap 604 and the wire bonding terminals 203, the leaked resin accumulates in the groove 209 provided in the etch-back region 207. The depth T2 of the groove 209 is equal to the sum of the thickness of the solder resist and the thickness of the copper pattern of the outer layer and is several ten to several hundred micrometers. The depth T2 is larger than the height T1 of the gap 604 that is several micrometers to several ten micrometers. Moreover, the width W2 of the groove 209 is designed so that the sectional area of the groove 209 obtained from product of the height T2 and width W2 of the groove 209 will be larger than the sectional area of the gap 604 in the same section obtained from the product of the height T1 and width W1 of the gap 604. This prevents reaching of the leaked resin to the wire bonding terminals 203 over the groove 209.

As mentioned above, the printed circuit board 200 that constitutes the sensor package 100 concerning the first embodiment is provided with the groove 209 formed by the etch back between the wire bonding terminal 203 and the frame 400. This prevents adhesion of the resin leaked when molding the frame 400 to the wire bonding terminals 203 even if the gap 604 occurs between the metal molds 600 and the printed circuit board 200. Moreover, even if the metal molds 600 are adjusted so that the gap 604 will always occur in consideration of manufacturing variation of the thickness of the printed circuit board 200, the frame 400 is stably molded by the insert molding, which avoids increasing the manufacturing cost.

Figure 8A:
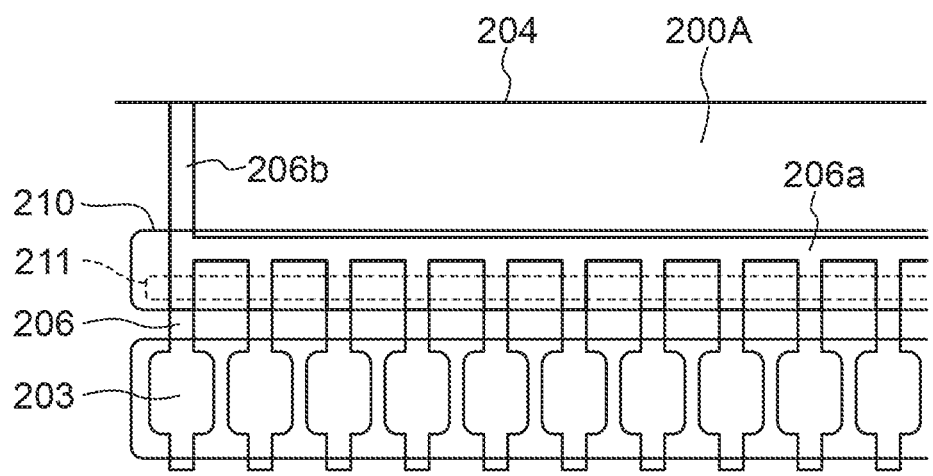
FIG. 8A and FIG. 8B are enlarged views showing a wire bonding terminal section provided in a printed circuit board that constitutes a sensor package concerning a second embodiment.
Figure 8B:
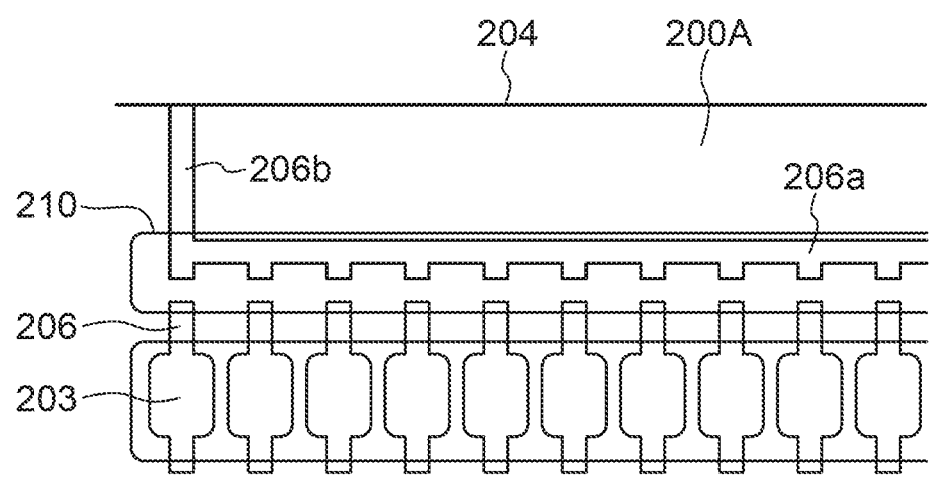

Next, a sensor package concerning a second embodiment will be described. FIG. 8A and FIG. 8B are enlarged views showing wire bonding terminals provided in a printed circuit board 200A that constitutes a sensor package concerning the second embodiment. It should be noted that members of the printed circuit board 200A that are common to the members of the printed circuit board 200 are described by using the same names and the same reference numerals. FIG. 8A shows a state of the printed circuit board 200A earlier than the etch-back process, and FIG. 8B shows a state of the printed circuit board 200A later than the etch-back process.

In the state earlier than the etch-back process, the plating bars 206 pulled out from the wire bonding terminals 203 are unified in the resist opening region 210 with the plating bar connection part 206a, and one plating bar 206b is led out from the unified part to the outside of the substrate. The gold-plating process is applied to the respective wire bonding terminals 203 by performing the electrolytic gold-plating process in this state.

After that, the etch-back process in accordance with the description in the first embodiment is applied. In the first embodiment, the etch-back process is applied to the plating bar connection part 206a of the printed circuit board 200 to remove the pattern. Against this, in the second embodiment, the etch-back process is applied to the etch-back region 211 between the plating bars 206 and the plating bar connection part 206a of the printed circuit board 200A. Since parts of the plating bars 206 are removed in the etch-back region 211, the plating bar connection part 206a is insulated from the wire bonding terminals 203. Accordingly, the plating bar connection part 206a (conductor part) remains on the printed circuit board 200A after the etch-back process and is exposed to the surface as shown in FIG. 8B.

Figure 9:
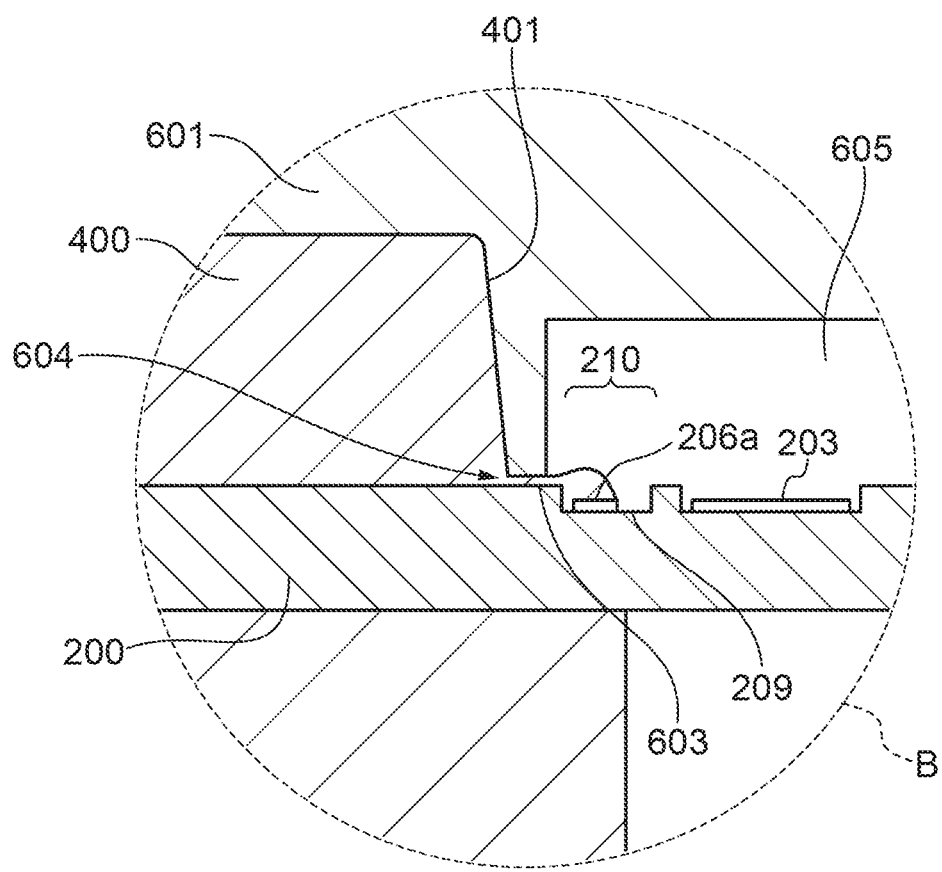
FIG. 9 is a sectional view describing a state where the metal molds are attached to the printed circuit board of FIG. 7 using the configuration in the area B shown in FIG. 5.

FIG. 9 is a sectional view describing the state where the metal molds 600 are attached to the printed circuit board 200A using the configuration in the area B shown in FIG. 5. The upper metal mold 601 of the metal molds 600 has the gap 604 with respect to the printed circuit board 200A. The resin poured into the cavity of the metal molds 600 to form the frame 400 leaks through the gap 604 to the inside of the printed circuit board 200. The solder resist and the copper pattern of the outer layer in the resist opening region 210 shown in FIG. 8 are partially removed and form the groove 209 of several ten through several hundred micrometers.

The resin (thermosetting resin) used for molding the frame 400 is anaerobic resin in general. The anaerobic resin bonds (cures) by intercepting oxygen under presence of metal ions. Liquid acrylic resin, which is an example of the anaerobic resin, does not cure in air but the curing is accelerated when contacting metal.

As shown in FIG. 8B, the plating bar connection part 206a is exposed in the printed circuit board 200A. Accordingly, the resin leaked through the gap 604 enters into the groove 209 first. Since the plating bar connection part 206a is exposed in the groove 209, the resin contacts the plating bar connection part 206a and the curing is accelerated. This avoids invasion of the resin into the wire bonding terminals 203 inside the plating bar connection part 206a.

As mentioned above, since the groove 209 and the plating bar connection part 206a are exposed between the wire bonding terminals 203 and the frame 400 in the second embodiment, the leaked resin is absorbed by the groove 209 and the curing is accelerated by contacting the plating bar connection part 206a, even if the gap 604 occurs between the metal molds 600 and the printed circuit board 200. As a result, since the frame 400 is stably molded to the printed circuit board 200A by the insert molding while preventing the leaked resin from adhering to the wire bonding terminals 203, the increase in the manufacturing cost is prevented. Moreover, since the allowable range of the thickness variation of the printed circuit board 200A enlarges, the manufacturing yield of the printed circuit board 200A increases, which reduces the manufacturing cost of the sensor package.

Figure 10:
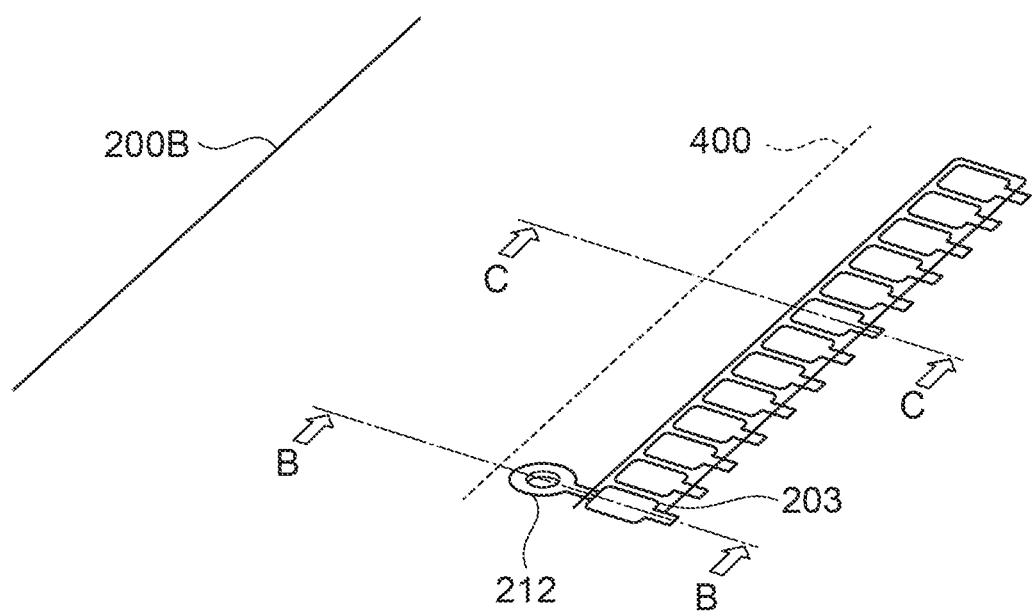
FIG. 10 is an enlarged view showing a wire bonding terminal section provided in a printed circuit board that constitutes a sensor package concerning a third embodiment.

Next, a sensor package concerning a third embodiment will be described. FIG. 10 is an enlarged view showing a wire bonding terminal section provided in a printed circuit board 200B that constitutes the sensor package concerning the third embodiment. It should be noted that members of the printed circuit board 200B that are common to the members of the printed circuit boards 200 and 200A are described by using the same names and the same reference numerals.

The printed circuit board 200B is a multilayer substrate that is provided with a via hole 212 between the wire bonding terminal section and the frame 400 shown by a broken line. The via hole 212 is formed by forming a hole in an insulation layer between wiring layers by means of laser or a drill and by applying the plating process to an inner wall of the hole. The via hole 212 is used to guide signals of an outer layer or an internal layer to other layers in the printed circuit board 200B. It should be noted that the wire bonding terminals 203 are respectively connected to the via hole 212 through wirings (not shown) and become the same electric potential. However, these do not necessarily need to be the same electric potential. The electrolytic gold-plating process to the wire bonding terminals 203 is performed using a wiring connected to the via hole 212.

Figure 11:
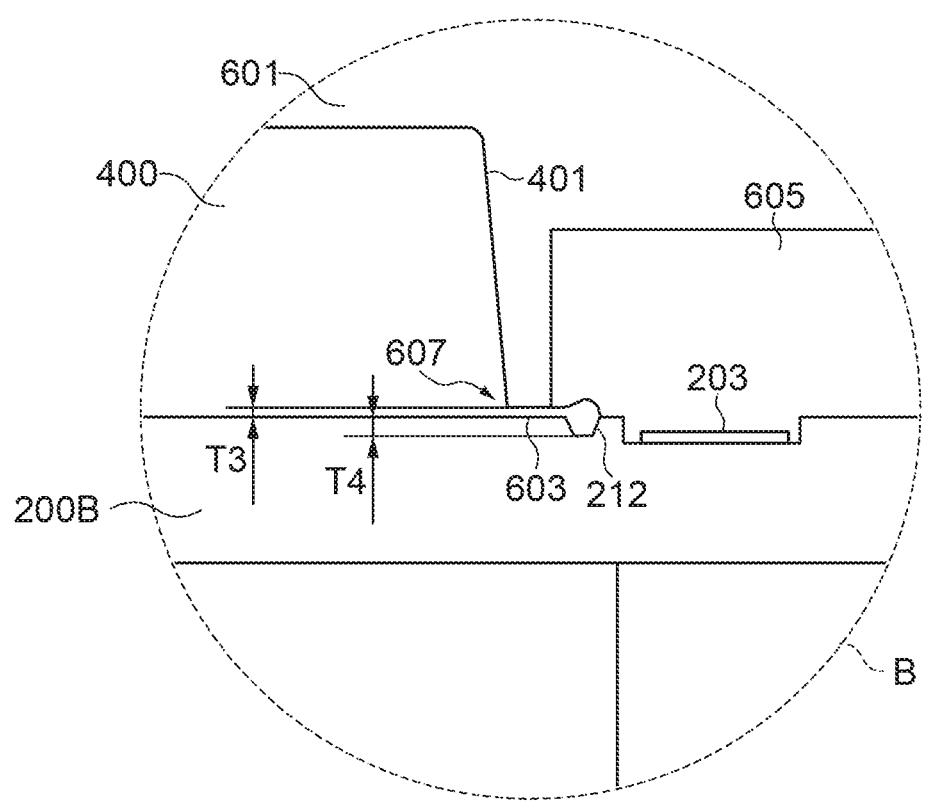
FIG. 11 is a sectional view showing a state where the metal molds are attached to the printed circuit board of FIG. 10 taken along the line B-B of FIG. 10.

FIG. 11 is a sectional view showing a state where the metal molds 600 are attached to the printed circuit board 200B taken along the line B-B of FIG. 10. The section shown in FIG. 11 corresponds to the area B shown in FIG. 5. Hatching that shows a section of a member is omitted in FIG. 11 in order to unveil a measurement of each part. Moreover, members shown in FIG. 11 that are common to the members shown in FIG. 6A through FIG. 7 are described by using the same names and the same reference numerals for simplifying the description.

The upper metal mold 601 of the metal molds 600 has the gap 604 with respect to the printed circuit board 200B. The resin poured into the cavity of the metal molds 600 to form the frame 400 leaks through the gap 607 to the inside of the printed circuit board 200B. A height T3 of the gap 607 is equal to several ten micrometers. Against this, a depth T4 of the via hole 212 is equal to the sum of the thickness of the copper pattern of the outer layer and the thickness of the insulation layer and is several ten to several hundred micrometers. The depth T3 is less than the depth T4 (T3<T4). Accordingly, the resin leaked through the gap 607 accumulates in the via hole 212. In this way, when the via hole 212 is provided for a predetermined wire bonding terminal 203, adhesion of the resin that is leaked through the gap 607 during the molding of the frame 400 to the wire bonding terminal 203 is avoidable.

Incidentally, since the wire bonding terminals 203 are provided on the printed circuit board 200B at several hundred to several thousand points, the following first and second problems will occur if the via holes 212 are provided for all the wire bonding terminals 203. The first problem is that the manufacture cycle time of the printed circuit board 200B will increase if the holes 212 are provided for all the wire bonding terminals 203 using laser or a drill. This increases the manufacturing cost. The second problem is that the strength of the printed circuit board 200B will reduce if many via holes 212 are provided near the wire bonding terminals 203. Particularly, the manufacturing process of the sensor package 100 in this embodiment includes processes for applying pressure and heat from outside to the printed circuit board 200B, such as molding of the frame 400, mounting (paste) of the image sensor 300, and the wire bonding. Accordingly, the strength reduction of the printed circuit board 200B may cause fatal defects, such as poor molding of the frame 400 and wire bonding exfoliation.

Figure 12:
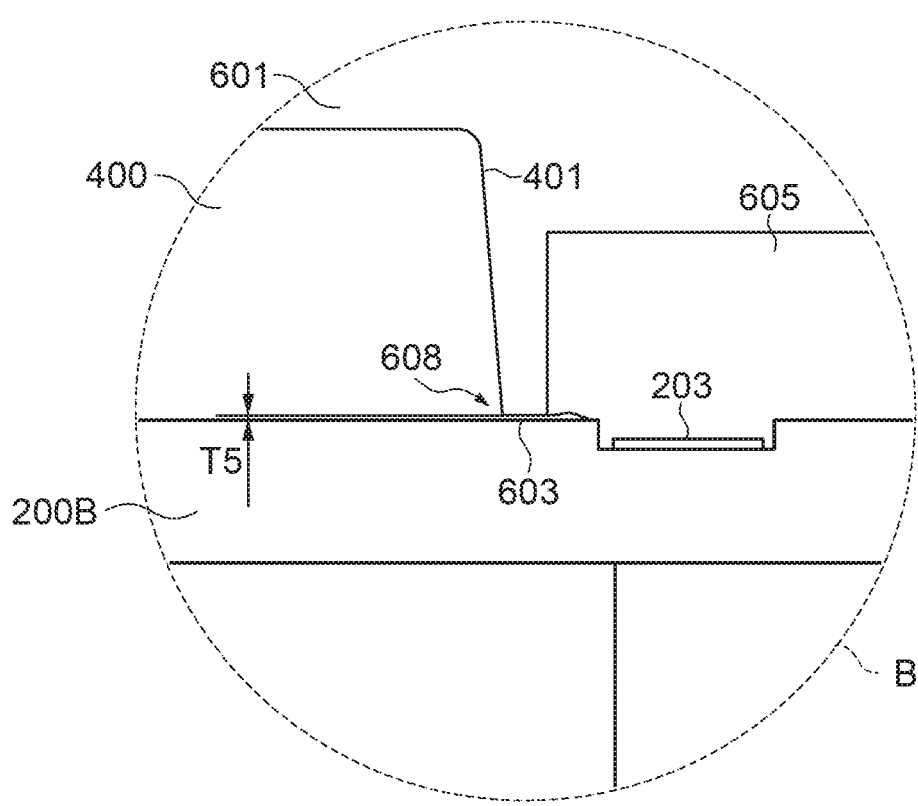
FIG. 12 is a sectional view showing the state where the metal molds are attached to the printed circuit board of FIG. 10 taken along the line C-C of FIG. 10.

The printed circuit board 200B is provided with the configuration that solves the above-mentioned first and second problems. The configuration will be described by referring to FIG. 12. FIG. 12 is a sectional view showing the state where the metal molds 600 are attached to the printed circuit board 200B taken along the line C-C of FIG. 10.

The upper metal mold 601 of the metal molds 600 has a gap 608 with respect to the printed circuit board 200B in an area in which the via hole 212 is not formed for a wire bonding terminal 203. Then, a height T5 of the gap 608 is less than the height T3 of the gap 607 shown in FIG. 11 (T5<T3). Since the melted resin injected into the cavity of the metal molds 600 has certain viscosity, the resin leaks through a larger gap preferentially when the gaps that have different heights are formed between the printed circuit board 200 and the upper metal mold 601. That is, the resin leaks through the gap 607 preferentially rather than the gap 608.

As mentioned above, since the via hole 212 is provided between the gap 607 and the wire bonding terminal 203, the resin leaked to the inside of the printed circuit board 200B accumulates in the via hole 212 and is dammed up, which prevents the adhesion of the resin to the wire bonding terminal 203. A little resin leaks through the gap 608 to the inside of the printed circuit board 200B. However, when the parameters, such as the relative height of the gaps 608 and 607, the depth of the via hole 212, and the distance from the wire bonding terminals 203 to the gaps 608 and 607, are set appropriately, the resin that is leaked to the inside of the printed circuit board 200B through the gap 608 is prevented from reaching the wire bonding terminals 203.

Figure 13:
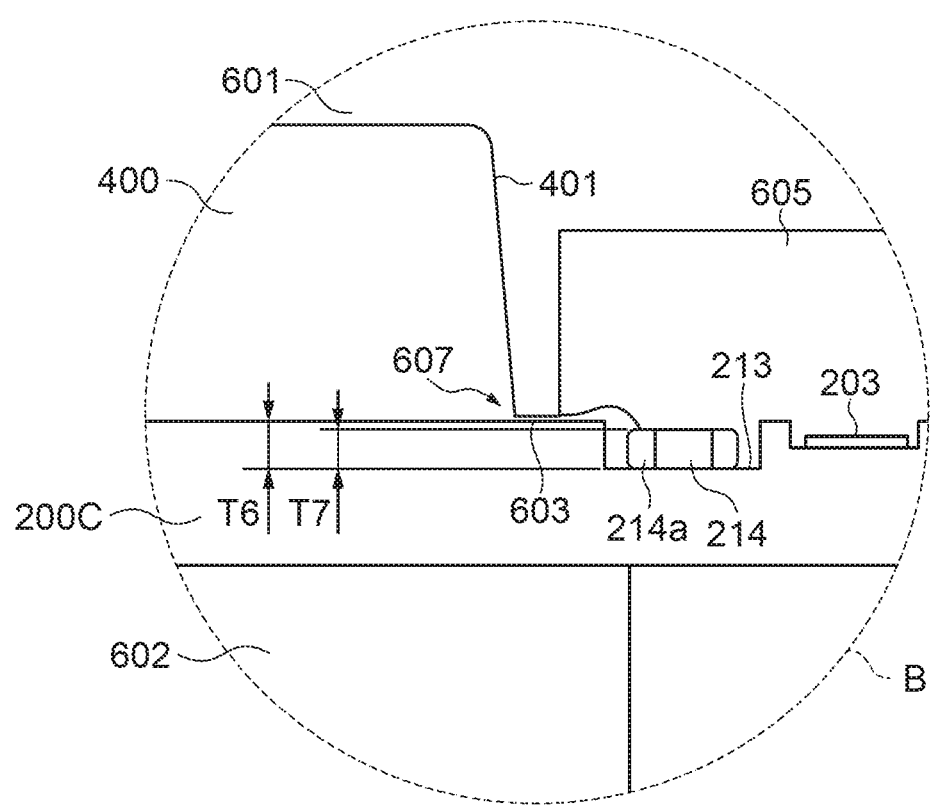
FIG. 13 is a view showing a state where the metal molds are attached to a printed circuit board that constitutes a sensor package concerning a fourth embodiment in the same way as FIG. 7.

Next, a sensor package concerning a fourth embodiment will be described. FIG. 13 is a view showing a state where the metal molds 600 are attached to a printed circuit board 200C that constitutes the sensor package concerning the fourth embodiment in the same way as FIG. 7. It should be noted that FIG. 13 shows an area corresponding to the area B in FIG. 5 in the same way as FIG. 7 and that hatching showing a section of a member is omitted in order to unveil a measurement of each part. Moreover, members of the printed circuit board 200C that are common to the members of the printed circuit boards 200, 200A, and 200B are described by using the same names and the same reference numerals in the following description.

The upper metal mold 601 of the metal molds 600 has the gap 607 with respect to the printed circuit board 200C. The thermosetting resin poured into the cavity of the metal molds 600 to form the frame 400 leaks through the gap 607 to the inside of the printed circuit board 200C. A groove 213 is provided between the gap 607 and the wire bonding terminal 203 for mounting to an internal layer of the substrate. A chip 214 is mounted in the groove 213.

The chip 214 is an electrical component, such as a resister or a capacitor, or an electronic part and is mounted in the groove 213 by using a mounting technology. The mounting technology is a technique that forms a space in which a desired mounting component can be mounted in an inner layer of a mounting substrate and mounts the component in the space. The substrate to which a component is mounted to an inner layer of the substrate by using the mounting technology (hereinafter referred to as an "inner-layer mounting substrate") is able to thin the thickness of the substrate including the component. This enables the miniaturization of the sensor package 100. Moreover, a surface mounting substrate that a component is mounted on a substrate surface needs to lead out a signal wire from the inside of the substrate to the substrate surface in order to guide a signal in the substrate to the component on the substrate surface. Against this, since the inner-layer mounting substrate enables wiring (connecting) inside the substrate and does not need to lead out a signal wire from the inside of the substrate to the substrate surface, a signal quality is improved by shortening of a wire length.

The space in the substrate inner layer is formed by a method of forming a groove with drilling after making the substrate or by a method of laminating an insulating layer and a conductor layer that have notches corresponding to a shape of a component. The groove on the substrate surface of the printed circuit board 200C may be formed by the drilling or the lamination of an insulating layer and a conductor layer that have notches.

FIG. 13 shows the state where the upper metal mold 601 and the lower metal mold 602 are attached to the printed circuit board 200C as with the third embodiment. The upper metal mold 601 of the metal molds 600 has the gap 607 with respect to the printed circuit board 200C. The thermosetting resin poured into the cavity of the metal molds 600 to form the frame 400 leaks through the gap 607 to the inside of the printed circuit board 200C.

In the printed circuit board 200C, a height T7 of the chip 214 is less than a depth T6 of the groove 213 (T7<T6). The resin that leaks through the gap 607 enters into the groove 213. Furthermore, a part of the resin that leaks through the gap 607 may run onto the chip 214. The chip 214 has a metal terminal 214a for mounting to the printed circuit board 200C.

As mentioned above, the thermosetting resin used for the frame 400 is anaerobic resin of which curing is accelerated when contacting metal. Accordingly, the resin that enters into the groove 213 contacts the metal terminal part 214a and the curing is accelerated. This prevents reaching of the leaked resin to the wire bonding terminals 203.

It should be noted that the height T7 of the chip 214 is less than the depth T6 of the groove 213 in this embodiment. Thereby, the effect obtained by the mounting technology that the substrate thickness becomes thin is sufficiently harnessed. In the meantime, the height T7 of the chip 214 may be more than the depth T6 of the groove 213 in a case where the necessity of thinning the substrate thickness is low. In such a case, the resin that leaks through the gap 607 also flows into the groove 213 and is dammed up by the chip 214, and the curing is accelerated by contacting the metal terminal 214a. The same effect as the second embodiment is obtained.

It should be noted that the wire bonding terminals 203 are provided on the printed circuit board 200B at several hundred through several thousand points as with the third embodiment. Accordingly, if the groove 213 is provided for every wire bonding terminal 203 and the chip 214 is mounted in every groove 213, the manufacture cycle of the printed circuit board 200C will increase and the strength will decrease. Accordingly, a place through which the resin leaks preferentially is formed in the same way as the third embodiment that forms the gaps 607 and 608 that have different heights between the metal molds 600 and the printed circuit board 200B. The leaked resin is absorbed by forming the groove 213 at the place through which the resin leaks preferentially and by mounting the chip 214 to the groove 213. This reduces (localizes) the places at which the groove 213 and the chip 214 are set, which avoids increasing the manufacture cycle time and reducing the strength.

Although the present invention has been described in detail on the basis of the suitable embodiments, the present invention is not limited to these specific embodiments and includes various configurations that do not deviate from the scope of the present invention. Furthermore, the embodiments mentioned above show examples of the present invention, and it is possible to combine the embodiments suitably.

For example, the sensor packages concerning the embodiments of the present invention are not only applicable to a digital single-lens reflex camera but also applicable to other image pickup apparatuses, such as a mirrorless single-lens reflex camera and a compact camera, and to various kinds of electronic devices that are equipped with an image pickup function. Moreover, a sensor package of the present invention may include both of the groove 209 that is a characteristic configuration of the printed circuit board 200 and the plating bar connection part 206a that is a characteristic configuration of the printed circuit board 200A. This prevents the adhesion of the leaked resin to the wire bonding terminals 203 during the insert molding of the frame 400 more certainly.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2019-159620, filed Sep. 2, 2019, No. 2020-103090, filed Jun. 15, 2020, and No. 2020-122340, filed Jul. 16, 2020, which are hereby incorporated by reference herein in their entireties.

What is claimed is:
1. A sensor package comprising:
an image sensor;
a mounting substrate to which the image sensor is mounted;
a frame provided in the mounting substrate so as to surround the image sensor; and
a cover attached to the frame so as to cover the image sensor,
wherein the mounting substrate comprises:
terminals electrically connected with the image sensor; and
a groove formed along an entire edge of the image sensor by etching a portion of the mounting substrate in a predetermined depth between an area in which the frame is provided and the terminals, wherein the groove includes a recess that collects excess resin constituting the frame to prevent resin flow into an inside of the sensor package, and wherein the recess is not a through hole.

2. The sensor package according to claim 1, wherein the frame is made from thermosetting anaerobic resin.

3. The sensor package according to claim 1, wherein a gold plating layer is formed on surfaces of the terminals.

4. The sensor package according to claim 1, wherein a chip is mounted in the groove.

5. A mounting substrate to which an image sensor is mounted, the mounting substrate comprising:

terminals electrically connected with the image sensor; and a groove formed along an entire edge of the image sensor by etching a portion of the mounting substrate in a predetermined depth between an area in which a frame is provided so as to surround the image sensor and the terminals, wherein the groove includes a recess that collects excess resin constituting the frame to prevent resin flow into an inside of the sensor package, and wherein the recess is not a through hole.

6. The mounting substrate according to claim 5, wherein a chip is mounted in the groove.

7. A sensor package comprising:

an image sensor;

a mounting substrate to which the image sensor is mounted;

a frame provided in the mounting substrate so as to surround the image sensor; and a cover attached to the frame so as to cover the image sensor, wherein the mounting substrate comprises:

terminals electrically connected with the image sensor; and a groove provided in a predetermined depth between an area in which the frame is provided so as to surround the image sensor and the terminals, and wherein the mounting substrate to which the groove is formed is clamped with metal molds, and the frame is formed from resin by insert molding on the mounting substrate outside the groove.

8. The sensor package according to claim 7, wherein the frame is made from thermosetting anaerobic resin.

9. The sensor package according to claim 7, wherein a gold plating layer is formed on surfaces of the terminals.

10. The sensor package according to claim 7, wherein a chip is mounted in the groove.

11. A mounting substrate to which an image sensor is mounted, the mounting substrate comprising:

terminals electrically connected with the image sensor; and a groove provided in a predetermined depth between an area in which a frame is provided so as to surround the image sensor and the terminals, wherein the mounting substrate to which the groove is formed is clamped with metal molds, and the frame is formed from resin by insert molding on the mounting substrate outside the groove.

12. The mounting substrate according to claim 11, wherein a chip is mounted in the groove.

* * * * *